United States Patent
Akiba et al.

(10) Patent No.: US 9,060,435 B2
(45) Date of Patent: Jun. 16, 2015

(54) GLASS PLATE FOR DISPLAY DEVICE, PLATE GLASS FOR DISPLAY DEVICE AND PRODUCTION PROCESS THEREOF

(71) Applicant: Asahi Glass Company, Limited, Chiyoda-ku (JP)

(72) Inventors: Shusaku Akiba, Tokyo (JP); Kazutaka Hayashi, Tokyo (JP)

(73) Assignee: ASAHI GLASS COMPANY, LIMITED, Chiyoda-ku (JP)

( * ) Notice: Subject to any disclaimer, the term of this patent is extended or adjusted under 35 U.S.C. 154(b) by 27 days.

(21) Appl. No.: 13/827,860

(22) Filed: Mar. 14, 2013

(65) Prior Publication Data

US 2013/0201613 A1 Aug. 8, 2013

Related U.S. Application Data

(63) Continuation of application No. 12/888,019, filed on Sep. 22, 2010, now abandoned.

(30) Foreign Application Priority Data

Oct. 20, 2009 (JP) ................. 2009-241524

(51) Int. Cl.
- *C03C 3/085* (2006.01)
- *H05K 5/03* (2006.01)
- *C03C 3/087* (2006.01)
- *C03C 3/078* (2006.01)

(52) U.S. Cl.
CPC *H05K 5/03* (2013.01); *C03C 3/087* (2013.01); *C03C 3/078* (2013.01); *C03C 3/085* (2013.01)

(58) Field of Classification Search
CPC ........ C03C 3/085; C03C 3/078; C03C 3/087; H05K 5/03
USPC .......... 501/69, 72; 313/598, 582; 361/679.01, 361/679.02, 679.21, 679.22, 679.26, 679.3; 362/559
See application file for complete search history.

(56) References Cited

U.S. PATENT DOCUMENTS

| | | | |
|---|---|---|---|
| 3,772,135 A | 11/1973 | Hara et al. | |
| 5,858,897 A | 1/1999 | Maeda et al. | |
| 6,518,211 B1 * | 2/2003 | Bradshaw et al. | 501/69 |
| 8,072,431 B2 * | 12/2011 | Nishi et al. | 345/173 |
| 8,168,295 B2 * | 5/2012 | Murata | 428/410 |
| 8,715,829 B2 * | 5/2014 | Akiba et al. | 428/410 |
| 2009/0298669 A1 | 12/2009 | Akiba et al. | |
| 2010/0190630 A1 | 7/2010 | Nishizawa et al. | |
| 2011/0071012 A1 | 3/2011 | Kondo et al. | |
| 2013/0011650 A1 | 1/2013 | Akiba et al. | |

FOREIGN PATENT DOCUMENTS

| | | |
|---|---|---|
| CN | 101155761 A | 4/2008 |
| JP | 46-42108 | 12/1971 |
| JP | 2007-11210 | 1/2007 |
| JP | 2009-57271 | 3/2009 |
| WO | WO 2007004634 A1 * | 1/2007 |
| WO | WO 2009019965 A1 * | 2/2009 |
| WO | 2009-060871 | 5/2009 |

OTHER PUBLICATIONS

Translation of JP 46-42108, Dec. 13 1971.*

* cited by examiner

*Primary Examiner* — Anthony J Green
*Assistant Examiner* — Elizabeth A Bolden
(74) *Attorney, Agent, or Firm* — Oblon, McClelland, Maier & Neustadt, L.L.P.

(57) ABSTRACT

A process for producing a plate glass for a display device having a thickness of at most 1.5 mm by a float process, wherein the plate glass comprises, as represented by mole percentage based on the following oxides, from 67 to 75% of $SiO_2$, from 0 to 4% of $Al_2O_3$, from 7 to 15% of $Na_2O$, from 1 to 9% of $K_2O$, from 6 to 14% of MgO and from 0 to 1.5% of $ZrO_2$, has a total content of $SiO_2$ and $Al_2O_3$ of from 71 to 75%, has a total content $Na_2O+K_2O$ of $Na_2O$ and $K_2O$ of from 12 to 20%, and has a content of CaO of less than 1% if contained.

14 Claims, No Drawings

US 9,060,435 B2

GLASS PLATE FOR DISPLAY DEVICE, PLATE GLASS FOR DISPLAY DEVICE AND PRODUCTION PROCESS THEREOF

CROSS REFERENCE TO RELATED APPLICATION

The present application is a Continuation of U.S. application Ser. No. 12/888,019 filed Sep. 22, 2010, and in turn claims priority to JP 2009-241524 filed on Oct. 20, 2009, the entire contents of each of which are hereby incorporated herein by reference.

BACKGROUND OF THE INVENTION

1. Field of the Invention

The present invention relates to a glass plate for e.g. a cover glass or a glass substrate of a display device, typically a mobile device such as a cell phone or a personal digital assistance (PDA) or a small display device such as a touch panel, a plate glass used for production of such a glass plate, a process for producing such a plate glass, a cover glass and a display device.

2. Discussion of Background

In recent years, for mobile devices such as cell phones and PDA, use of a cover glass (protective glass) for protecting a display and improving appearance, is increasing.

Weight reduction and thickness reduction are required for such portable digital devices. Therefore, a cover glass used for protecting a display is also required to be thin. However, if the thickness of the cover glass is made to be thin, the strength is lowered, and if a display device is dropped at a time of using or carrying it, the cover glass itself may sometimes be broken. Therefore, there is a problem that the cover glass cannot accomplish the original object to protect display devices.

In order to solve the above problem, it is conceivable to improve the strength of the cover glass, and as such a method, a method to form a compressive stress layer on a glass surface is commonly known.

As the method to form a compressive stress layer on a glass surface, typical are an air quenching tempering method (physical tempering method) wherein a surface of a glass plate heated to near the softening point is quenched by air cooling or the like and a chemical tempering method wherein alkali metal ions having a small ion radius (typically Li ions or Na ions) on a glass plate surface are exchanged with alkali ions having a larger ion radius (typically K ions) by ion exchange at a temperature lower than the glass transition point.

As mentioned above, the thickness of the cover glass is required to be thin. If the air quenching tempering method is applied to a thin glass plate, the temperature difference between the surface and the inside tends not to arise, and it is thereby difficult to form a compressive stress layer, and the desired property of high strength cannot be obtained. Therefore, a cover glass tempered by the latter chemical tempering method is usually used.

As such a cover glass, glass having soda lime glass chemically tempered is widely used (e.g. Patent Document 1).

$SiO_2$—$Al_2O_3$—$Na_2O$ glass other than the soda lime glass has also been proposed as a cover glass, and as a process of such glass, a downdraw process or an overflow downdraw process has been assumed (e.g. Patent Document 2).

Patent Document 1: JP-A-2007-11210
Patent Document 2: JP-A-2009-57271

A cover glass or the like for a mobile device may have a hole having a function as a speaker or the like, or it is preferred to have a complicated shape in view of the design. Accordingly, when a plate glass for a cover glass is processed to form a glass plate for a cover glass, it is subjected to a complicated process such as drilling or scribing a curve to be formed into a glass plate having a final shape in many cases.

If chipping occurs when such a plate glass (so-called raw plate glass) is processed, latent flaws are also formed at the same time. Such chipping formed at the time of processing before chemical tempering treatment has not conventionally been problematic. However, in a case where a glass plate which has remaining latent flaws which have been formed at the same time as chipping by processing is chemically tempered, if the latent flaws are so deep that they are beyond the compressive stress layer, the improvement in the strength of the glass plate may be insufficient. Further, if the latent flaws are present in an interior tensile stress layer of glass, cracks may expand by themselves and the glass may voluntarily break.

Further, in a case where chemical tempering treatment is carried out while glass dust formed by chipping is attached to the surface of the glass plate, only that portion is not tempered and may cause a drawback such as a dent or warpage. That is, the chipping may cause a product failure other than the latent flaws, which may lead to a decrease in the strength.

Further, substrates before processing are getting larger so as to improve the productivity, and may have a G4 (680×880) size or a G5 (1100×1300) size.

In a case where such a large substrate is processed, as the one side tends to be long, formation of deep latent flaws is highly possible. Further, as the substrate gets larger, it is heavier and is likely to bend, and the probability of breakage from the latent flaws tends to be high.

Accordingly, the probability of chipping is increased by the increase in size of the substrate, and the breakage failure of glass may be increased in the substrate processing step.

Such problems due to the chipping are more serious due to an increase in the demand for a reduction in the thickness of a cover glass accompanying need for weight saving of e.g. mobile devices. That is, if the thickness of a cover glass is reduced form 2 mm to 1 mm, the strength is reduced to one quarter, and the above-described problems are more serious.

Further, such a cover glass is suitably formed by a downdraw process such as a downdraw process or an overflow downdraw method in many cases, but such a method is not necessarily applicable to mass production.

SUMMARY OF THE INVENTION

It is an object of the present invention to solve the above problems.

The present invention provides a process (production process of the present invention) for producing a plate glass for a display device having a thickness of at most 1.5 mm by a float process, wherein the plate glass comprises, as represented by mole percentage based on the following oxides, from 67 to 75% of $SiO_2$, from 0 to 4% of $Al_2O_3$, from 7 to 15% of $Na_2O$, from 1 to 9% of $K_2O$, from 6 to 14% of MgO and from 0 to 1.5% of $ZrO_2$, has a total content of $SiO_2$ and $Al_2O_3$ of from 71 to 75%, has a total content $Na_2O+K_2O$ of $Na_2O$ and $K_2O$ of from 12 to 20%, and has a content of CaO of less than 1% if contained.

Further, the present invention provides the above process for producing a plate glass for a display device, wherein the $SiO_2$ content of the plate glass is from 69 to 74%.

Further, the present invention provides the above process for producing a plate glass for a display device, wherein the $Al_2O_3$ content of the plate glass is at least 0% and less than 3%.

Further, the present invention provides the above process for producing a plate glass for a display device, wherein the MgO content of the plate glass is from 8 to 13%.

Further, the present invention provides the above process for producing a plate glass for a display device, wherein the total content $Na_2O+K_2O$ of the plate glass is higher than 13.5%.

Further, the present invention provides the above process for producing a plate glass for a display device, wherein when the plate glass contains at least one component of CaO, SrO, BaO and $ZrO_2$, the total content of these four components is less than 1.5%.

Further, the present invention provides the above process for producing a plate glass for a display device, wherein the $B_2O_3$, content of the plate glass is less than 1% if contained.

Further, the present invention provides the above process for producing a plate glass for a display device, wherein the temperature at which the viscosity of the plate glass is $10^2$ dPa·s is at most 1,650° C.

Further, the present invention provides the above process for producing a plate glass for a display device, wherein the average linear expansion coefficient of the plate glass at from 50 to 350° C. is higher than $86 \times 10^{-7}$/° C.

Further, the present invention provides a plate glass (plate glass of the present invention) for a display device having a thickness of at most 1.5 mm, comprising, as represented by mole percentage based on the following oxides, from 67 to 75% of $SiO_2$, from 0 to 4% of $Al_2O_3$, from 7 to 15% of $Na_2O$, from 1 to 9% of $K_2O$, from 6 to 14% of MgO and from 0 to 1.5% of $ZrO_2$, having a total content of $SiO_2$ and $Al_2O_3$ of from 71 to 75%, having a total content $Na_2O+K_2O$ of $Na_2O$ and $K_2O$ of from 12 to 20%, and having a content of CaO of less than 1% if contained.

Further, the present invention provides the plate glass for a display device, which has an $Al_2O_3$ content of at least 0% and less than 3%.

Further, the present invention provides the plate glass for a display device, which has a total content $Na_2O+K_2O$ of higher than 13.5%.

Further, the present invention provides the plate glass for a display device, which has an average linear expansion coefficient at from 50 to 350° C. of higher than $86 \times 10^{-7}$/° C.

Further, the present invention provides a glass plate for a display device, obtained by chemically tempering a glass plate having a thickness of at most 1 mm, comprising, as represented by mole percentage based on the following oxides, from 67 to 75% of $SiO_2$, from 0 to 4% of $Al_2O_3$, from 7 to 15% of $Na_2O$, from 1 to 9% of $K_2O$, from 6 to 14% of MgO, and from 0 to 1.5% of $ZrO_2$, having a total content of $SiO_2$ and $Al_2O_3$ of from 71 to 75%, having a total content $Na_2O+K_2O$ of $Na_2O$ and $K_2O$ of from 12 to 20%, and having a content of CaO of less than 1% if contained.

Further, the present invention provides a cover glass (cover glass of the present invention) for a display device, comprising the above glass plate for a display device.

Further, the present invention provides the above cover glass, wherein the display device is a mobile device.

Further, the present invention provides the above cover glass, wherein the display device is a touch panel.

Further, the present invention provides a display device comprising a display and a cover glass for protecting the display, wherein the cover glass is the cover glass of the present invention.

Further, the present invention provides a mobile device comprising a display and a cover glass for protecting the display, wherein the cover glass is the cover glass of the present invention.

Still further, the present invention provides a touch panel comprising a display and a cover glass for protecting the display, wherein the cover glass is the cover glass of the present invention.

According to the present invention, a thin plate glass for a display device, with which chipping is less likely to occur at the time of glass processing, and which is capable of chemical tempering treatment, can be obtained. Further, it is possible to produce such a thin plate glass by a float process.

Further, a glass plate and a cover glass for a display device, with which a decrease in the strength due to chipping at the time of glass processing before chemical tempering treatment is less likely to occur, and the possibility of destruction of glass by itself at the time of use is reduced, can be obtained.

Further, a mobile device and a touch panel comprising such a cover glass can be obtained.

DETAILED DESCRIPTION OF THE PREFERRED EMBODIMENTS

The upper limit of the thickness of the glass plate for a display device of the present invention is 1 mm, and the lower limit is typically 0.2 mm in the case of a cover glass. If the thickness is less than 0.2 mm, even though the chemical tempering is carried out, a problem may arise from the viewpoint of the strength for practical use. In a case where the glass plate is used as a glass substrate, the thickness is typically at least 0.05 mm.

Of a commercially available chemically tempered product of soda lime glass, the surface compressive stress was measured, whereupon it was 555 MPa. Accordingly, the surface compressive stress S of the glass plate for a display device of the present invention is preferably at least 550 MPa. S is typically at most 800 MPa.

Further, for production of a cover glass, glass is usually polished, and the size of abrasive grains used for first step polishing is typically 100 μm. By polishing using such abrasive gains, microcracks having a depth of 40 μm are considered to be formed (Glass Engineering Handbook, edited by Masayuki Yamane et al., first edition, Asakura Publishing Co., Ltd., Jul. 5, 1999, p. 397).

Accordingly, the depth t of the compressive stress layer of the glass plate for a display device of the present invention is preferably at least 40 μm. Further, t is typically at most 70 μm.

The glass plate for a display device of the present invention is usually obtained by processing the plate glass of the present invention e.g. by cutting, drilling or polishing to obtain a glass plate, and chemically tempering the glass plate.

The chemical tempering method is not particularly restricted as long as $Na_2O$ in the surface layer of the glass plate can be ion exchanged with $K_2O$ in a molten salt, however, a method may, for example, be mentioned wherein the glass plate is immersed in a heated potassium nitrate ($KNO_3$) molten salt.

The condition for forming a chemically tempered layer (a surface compressive stress layer) having a desired surface compressive stress on the glass plate varies depending on the thickness of the glass plate, however, typically the glass plate is immersed in a $KNO_3$ molten salt at from 350 to 550° C. for from 2 to 20 hours. From the viewpoint of cost, the glass is preferably immersed under a condition of at from 350 to 500° C. for from 2 to 16 hours, more preferably immersed for from 2 to 10 hours.

In a case where the above polishing is carried out, the amount of polishing is preferably small from the viewpoint of the production efficiency, and is usually at most 0.5 mm. Accordingly, the thickness of the plate glass of the present invention is considered to be at most 1.5 mm corresponding to the maximum thickness of the glass plate for a display device of the present invention, and is typically at most 1.3 mm.

The method for producing the plate glass of the present invention is not particularly restricted. For example, the plate glass is produced by mixing various raw materials in appropriate amounts, heating the mixture to about 1,400 to 1,600° C. to melt it, then defoaming and homogenizing the melt by stirring or the like, forming the melt into a plate shape by a well-known float process, downdraw process or press method, annealing the plate shape glass, and cutting it in a desired size. The plate glass of the present invention is typically produced by the production process of the present invention.

The glass of the plate glass produced by the production process of the present invention will be referred to as the glass of the present invention, and hereinafter the properties and the composition of the glass will be described. The glass of the present invention is the glass of the plate glass of the present invention, and the glass of the above glass plate chemically tempered to form a glass plate for a display device of the present invention.

Since a float process is employed in the production process of the present invention, usually a melting tank is used.

Accordingly, the temperature $T_2$ at which the viscosity of the glass of the present invention becomes $10^2$ dPa·s is preferably at most 1,650° C. If it exceeds 1,650° C., it is difficult to melt glass, product defects such as stones tend to form, or facility for melting glass may be expensive. It is preferably at most 1,620° C., typically at most 1,600° C.

Further, the temperature $T_4$ at which the viscosity of the glass of the present invention becomes $10^4$ dPa·s is preferably at most 1,190° C. If it exceeds 1,190° C., it is difficult to form glass. It is typically at most 1,180° C.

The devitrification temperature of the glass of the present invention is preferably at most ($T_4+10°$ C.). Otherwise, if a glass is formed by a float process, devitrification will occur, and it is difficult to form glass. It is more preferably at most $T_4$. Here, the devitrification temperature means the maximum temperature at which devitrification precipitates when the glass is maintained at that temperature for 15 hours.

The specific gravity of the glass of the present invention is preferably at most 2.5. If it exceeds 2.5, weight reduction of a display device may be insufficient.

The average linear expansion coefficient of the glass of the present invention at from 50 to 350° C. is preferably from $80\times10^{-7}$ to $130\times10^{-7}/°$ C., typically higher than $86\times10^{-7}/°$ C.

Now, the composition of the glass of the present invention will be described by using contents represented by mole percentage unless otherwise specified.

$SiO_2$ is a component to constitute a glass matrix and is essential. Further, it is a component to reduce chipping at the time of glass processing. If the $SiO_2$ content is less than 67%, stability of glass and weather resistance or chipping resistance will be decreased. It is typically at least 69%. If the $SiO_2$ content exceeds 75%, the viscosity of glass will be increased, and a melting property is remarkably lowered. It is typically at most 74%.

$Al_2O_3$ is not essential but is a component to improve the ion exchange performance and the chipping resistance and may be contained up to 4%. If its content exceeds 4%, the viscosity of the glass will be high, whereby homogeneous melting will be difficult. It is typically less than 3% or less than 6 mass %. In a case where $Al_2O_3$ is contained, its content is preferably at least 1%.

If the total content $SiO_2+Al_2O_3$ of $SiO_2$ and $Al_2O_3$ exceeds 75%, the viscosity of the glass at high temperature will be increased, whereby melting will be difficult. It is typically at most 74%. If it is less than 71%, the chipping resistance will be decreased. It is typically at least 72%.

$Na_2O$ is a component for forming a surface compressive stress layer by ion exchange and improving the melting property of the glass and is essential. If its content is less than 7%, it is difficult to form a desired surface compressive stress layer by ion exchange. It is typically at least 8%. If the $Na_2O$ content exceeds 15%, the weather resistance will be decreased. It is preferably at most 13%.

$K_2O$ is a component for improving the melting property as well as for increasing the ion exchange rate in the chemical tempering to obtain desired surface compressive stress and stress layer depth, and is essential. If its content is less than 1%, the melting property will be decreased, or the ion exchange rate will be decrease. It is preferably at least 3%, typically at least 4%. If the $K_2O$ content exceeds 9%, the weather resistance will be decreased. It is preferably at most 7%, typically at most 6%.

If the total content $Na_2O+K_2O$ of $Na_2O$ and $K_2O$ is less than 12%, no desired ion exchange property will be obtained. It is preferably at least 13%, typically higher than 13.5% or higher than 15.5 mass %. If $Na_2O+K_2O$ exceeds 20%, the chemical durability of the glass such as weather resistance will be low. It is preferably at most 18%, typically at most 17%.

MgO is a component which may lower the ion exchange rate or the chipping resistance, but is a component to improve the melting property and is essential. If its content is less than 6%, the viscosity will be increased, thus lowering the melting property. It is preferably at least 8%, typically at least 10%. If it exceeds 14%, the glass tends to be devitrified. It is preferably at most 13%, typically at most 12%.

$ZrO_2$ is not essential but may be contained up to 1.5% so as to decrease the viscosity at high temperature or to increase the surface compressive stress. If its content exceeds 1.5%, $ZrO_2$ may remain in the glass as stones. Further, the resistance against chipping may be decreased. In a case where $ZrO_2$ is contained, its content is typically at least 0.2%.

The glass of the present invention essentially comprises the above components, but may contain other component within a range not to impair the object of the present invention. In a case where such other component is contained, the total content of such components is preferably at most 5%, typically at most 3%. Now, the above other components will be explained.

ZnO may be contained for example up to 2% in order to improve the melting property of the glass at high temperature in some cases, but its content is preferably at most 1%. In a case where the glass is produced by a float process, the content is preferably at most 0.5%. If the content exceeds 0.5%, ZnO may be reduced at the time of producing the glass by the float process, and product defects may result. ZnO is typically not contained.

$B_2O_3$ may be contained for example up to less than 1% in order to improve the melting property at high temperature or the glass strength in some cases. If its content is at least 1%, it is difficult to obtain homogeneous glass, and to form glass, or the chipping resistance may be decreased. $B_2O_3$ is typically not contained.

Since $TiO_2$ changes an oxidation reduction state of Fe ions ($Fe^{2+}$, $Fe^{3+}$) present in the glass, whereby the visible light transmittance changes, and the glass is stained, if contained, the $TiO_2$ content is preferably at most 1%, and $TiO_2$ is typically not contained.

$Li_2O$ is a component to lower the strain point whereby stress tends to be relaxed, and as a result, a stable surface compressive stress layer cannot be obtained. Therefore, glass preferably contains no $Li_2O$. Even if $Li_2O$ is contained, its content is preferably less than 1%, more preferably at most 0.05%, particularly preferably less than 0.01%.

Further, at the time of chemical tempering treatment, $Li_2O$ sometimes elutes into a molten salt such as $KNO_3$, and if the chemical tempering treatment is carried out with a molten salt containing Li, the surface compress stress is remarkably lowered. That is, the present inventors chemically tempered the glass of the after-mentioned Example 20 by using $KNO_3$ containing no Li, $KNO_3$ containing 0.005 mass % of Li, $KNO_3$ containing 0.01 mass % of Li and $KNO_3$ containing 0.04 mass % of Li under the condition of 450° C. for 6 hours, and as a result, they found that the surface compressive stress was remarkably lowered even by the molten salt containing 0.005 mass % of Li. Therefore, from the above viewpoint, no $Li_2O$ is preferably contained.

CaO improves the melting property at high temperature or makes the glass be hardly devitrified, and thus may be contained up to less than 1%. If its content is at most 1%, the ion exchange rate or the chipping resistance will be decreased.

SrO may be contained as the case requires, but its content is preferably less than 1% if contained since it has a high effect of lowering the ion exchange rate as compared with MgO and CaO.

BaO has the highest effect of lowering the ion exchange rate among alkaline earth metal oxides, and thus it is preferred that no BaO is contained, or its content is less than 1% even if contained.

In a case where SrO or BaO is contained, their total content is preferably at most 1%, more preferably less than 0.3%.

In a case where at least one of CaO, SrO, BaO and $ZrO_2$ is contained, the total content of these four components is preferably less than 1.5%. If it is at least 1.5%, the ion exchange rate may be decreased. Typically it is at most 1%.

As a refining agent at the time of melting glass, $SO_3$, a chloride or a fluoride may appropriately be contained. However, in order to increase the visibility of display devices such as a touch panel, it is preferred to reduce contamination of impurities such as $Fe_2O_3$, NiO or $Cr_2O_3$ having an absorption in a visible light range in raw materials as far as possible, and the content of each of them is preferably at most 0.15%, more preferably at most 0.05% as represented by mass percentage.

EXAMPLES

Now, the present invention will be described in further detail with reference to Examples. However, it should be understood that the present invention is by no means restricted to such specific examples.

In Examples 1 to 12 and 20 to 22 shown in Tables 1 to 3, commonly used glass raw materials such as oxides, hydroxides, carbonates and nitrates were properly selected so as to have compositions as represented by mole percentage shown in columns of $SiO_2$ to $K_2O$, weighed to obtain 400 g of glass, and in addition, although not shown in the above-mentioned compositions, sodium sulfate corresponding to 0.2 mass % as calculated as $SO_3$ was added to the raw materials, and the raw materials were mixed. Then, the raw material mixture was put in a platinum crucible, the platinum crucible was put in a resistance heat type electric furnace at 1,600° C., the raw material mixture was melted for 3 hours, refined, homogenized and cast into a mold, and annealed at a predetermined temperature to obtain a glass block. The glass block was cut and polished and finally both surfaces were mirror polished to obtain a plate form glass having a size of 40 mm×40 mm×0.9 mm in thickness.

In Example 23 shown in Table 3, a separately prepared soda lime glass was used, and in Examples 13 to 19 shown in Tables 2 and 3, such melting of glass and the like is not carried out.

Examples 1 to 19 are examples of the present invention, and Examples 20 to 23 are comparative examples.

Further, compositions as represented by mass percentage corresponding to the compositions as represented by mole percentage shown in Tables 1 to 3 are shown in Tables 4 to 6.

Of the obtained glass, the glass transition point Tg (unit: ° C.), the temperature T2 (unit: ° C.) at which the viscosity becomes $10^2$ dPa·s, the temperature T4 (unit: ° C.) at which the viscosity becomes $10^4$ dPa·s, the specific gravity ρ, the average linear expansion coefficient a (unit: −7/° C.) at from 50 to 350° C., and the devitrification temperature Td (unit: ° C.) are shown.

Values with * are values obtained by calculation from the composition or estimated values, and the same applies to other measurement data such as the after-mentioned F. Further, the devitrification temperature was to be measured by whether the glass held at a certain temperature (X° C.) for 15 hours was devitrified or not, and if the glass was not devitrified at X° C., the result is represented by Td<X.

Further, the crack 50% start load F (unit: kg) of each glass was measured as follows by using a Vickers hardness tester.

Further, the above plate form glass was polished by #1000 abrasive grains for 300 μm or more, and then polished by cerium oxide so that the surface would be a mirror surface. Then, to remove the strain by processing on the mirror polished surface, the glass was heated to Tg+50° C. by a resistant heat type electric furnace and held at the temperature for one hour, and then cooled to room temperature at a rate of 0.5° C./min. The temperature was increased at such a temperature-raising rate that the temperature reached Tg in one hour.

Using samples subjected to the above treatment, the incidence of cracks was measured. That is, in the air, at a temperature of from 20 to 28° C. under a humidity of from 40 to 75%, while the load of the Vickers hardness tester was changed step by step from 0.025 kg, 0.05 kg, 0.1 kg, 0.2 kg, 0.3 kg, 0.5 kg, 1 kg to 2 kg, Vickers indenters were pressed at 10 points at each load, and the number of cracks formed from four corners of the indentation among the maximum of 40 was counted. The load at which 20 cracks were formed was read from a graph and regarded as the crack 50% start load F.

F is preferably at least 0.2 kg, more preferably at least 0.6 kg.

In Examples 5 and 20 to 23, a scribing test was carried out by using GLASS SCRIBER manufactured by JOYO ENGINEERING CO., LTD., and the chipping start load f (unit: N) was measured as follows.

A measurement sample for the scribing test was prepared in the same manner as the above sample for measurement of F.

In the scribing test, using a 130° diamond wheel cutter, while the load was changed step by step from 8.6 N to 26.6 N, scribing was carried out on the sample, whereupon the incidence of chipping was evaluated. The minimum load at which the chipping occurs was regarded as the chipping start load f.

In glass in Example 5 as an example of the present invention in which the above F is so large as 0.86 kg, chipping occurred for the first time at a high load of 15.8 N, whereas in glass in each of Examples 20 to 23 which are comparative examples in which F was so small as from 0.03 to 0.13 kg, chipping occurred at a load so low as 12.2 N. Thus, it is found that incidence of chipping is evaluated by the crack 50% start load.

The plate form glass in each of Examples 1 to 12, 20 and 23 was chemically tempered as follows. That is, the chemical tempering treatment was carried out by immersing such glass in a $KNO_3$ molten salt at 400° C. for 10 hours. Of each glass, the surface compressive stress S (unit: MPa) and the depth t (unit: μm) of the compressive stress layer were measured by a surface stress meter FSM-6000 manufactured by Orihara Seisakusho Corporation. The results are shown in columns in Tables. As evident from Tables, the glass in each of Examples of the present invention has a surface compressive stress of at least 550 MPa and a stress layer depth of at least 40 μm, and thus it is found that a desired compressive stress layer is formed.

TABLE 1

| | Ex. | | | | | | | | |
|---|---|---|---|---|---|---|---|---|---|
| | 1 | 2 | 3 | 4 | 5 | 6 | 7 | 8 | 9 |
| $SiO_2$ | 69.6 | 71.1 | 71.0 | 71.7 | 71.3 | 71.3 | 71.6 | 70.9 | 67.9 |
| $Al_2O_3$ | 3.0 | 2.0 | 2.0 | 2.0 | 2.0 | 2.0 | 2.0 | 2.0 | 3.3 |
| MgO | 12.0 | 11.5 | 11.0 | 10.5 | 10.4 | 11.8 | 11.8 | 10.6 | 12.8 |
| CaO | 0.3 | 0.3 | 0.3 | 0.3 | 0.3 | 0.3 | 0.3 | 0.3 | 0.3 |
| SrO | 0.03 | 0.03 | 0.03 | 0.03 | 0.03 | 0.03 | 0.03 | 0.03 | 0.03 |
| BaO | 0.02 | 0.02 | 0.02 | 0.02 | 0.02 | 0.02 | 0.02 | 0.02 | 0.02 |
| $ZrO_2$ | 0.5 | 0.5 | 1.0 | 0.5 | 0.5 | 0.5 | 0.5 | 1.5 | 1.2 |
| $Na_2O$ | 8.7 | 8.6 | 8.7 | 9.7 | 10.8 | 8.6 | 8.6 | 8.7 | 8.8 |
| $K_2O$ | 5.9 | 5.9 | 5.9 | 5.2 | 4.6 | 5.4 | 5.1 | 5.9 | 5.7 |
| Si + Al | 72.6 | 73.1 | 73.0 | 73.7 | 73.3 | 73.3 | 73.6 | 72.9 | 71.2 |
| Tg | 582 | 572 | 572 | 560 | 548 | 576 | 574 | 582 | 603 |
| T2 | 1600* | 1589 | 1602 | 1600* | 1569 | 1601* | 1604* | 1600* | 1580* |
| T4 | 1164* | 1154 | 1164 | 1153* | 1127 | 1159* | 1161* | 1166* | 1158* |
| ρ | 2.451 | 2.443 | 2.456 | 2.440 | 2.440 | 2.437 | 2.436 | 2.469 | 2.483 |
| S | 595 | 551 | 576 | 569 | 598 | 574 | 578 | 601 | 665 |
| t | 48 | 51 | 48 | 46 | 45 | 44 | 43 | 47 | 39 |
| α | 94 | 92 | 90 | 94 | 96 | 90 | 87 | 89 | 89 |
| Td | <1160 | <1160 | <1160 | <1150 | <1050 | <1150 | <1150 | <1160 | <1150 |
| F | 1.3 | 1.2 | 0.51 | 0.46 | 0.86 | 0.91 | 1.2 | 0.33 | 0.27 |
| f | — | — | — | — | 15.8 | — | — | — | — |

TABLE 2

| | Ex. | | | | | | | | |
|---|---|---|---|---|---|---|---|---|---|
| | 10 | 11 | 12 | 13 | 14 | 15 | 16 | 17 | 18 |
| $SiO_2$ | 67.2 | 68.8 | 68.7 | 69.8 | 71.6 | 74.8 | 75.0 | 75.0 | 75.0 |
| $Al_2O_3$ | 3.9 | 2.7 | 2.9 | 2.9 | 2.0 | 0 | 0 | 0 | 0 |
| MgO | 13.5 | 13.0 | 12.5 | 11.9 | 10.5 | 10.5 | 8.9 | 6.8 | 6.6 |
| CaO | 0.3 | 0.3 | 0.8 | 0.3 | 0 | 0 | 0 | 0 | 0 |
| SrO | 0.03 | 0.03 | 0.03 | 0 | 0 | 0 | 0 | 0 | 0 |
| BaO | 0.02 | 0.02 | 0.02 | 0 | 0 | 0 | 0 | 0 | 0 |
| $ZrO_2$ | 0.7 | 0.7 | 0.7 | 0.5 | 0.5 | 0 | 0 | 0 | 0 |
| $Na_2O$ | 8.7 | 8.7 | 8.7 | 8.7 | 10.9 | 9.9 | 15.0 | 12.6 | 15.0 |
| $K_2O$ | 5.7 | 5.7 | 5.6 | 5.9 | 4.6 | 4.7 | 1.1 | 5.6 | 3.4 |
| Si + Al | 71.1 | 71.5 | 71.6 | 72.7 | 73.6 | 74.8 | 75.0 | 75.0 | 75.0 |
| Tg | 603 | 585 | 587 | 582* | 547* | 556* | 540* | 500* | 500* |
| T2 | 1586 | 1584 | 1580* | 1599* | 1575* | 1600* | 1559* | 1594* | 1571* |
| T4 | 1160 | 1155 | 1150* | 1163* | 1131* | 1139* | 1086* | 1122* | 1095* |
| ρ | 2.474 | 2.464 | 2.467 | 2.45* | 2.44* | 2.41* | 2.41* | 2.41* | 2.41* |
| S | 660 | 626 | 628 | 595* | 614* | 600* | 748* | 550* | 661* |
| t | 40 | 42 | 40 | 49* | 46* | 53* | 45* | 64* | 58* |
| α | 90 | 89 | 89 | 94* | 96* | 87* | 91* | 99* | 99* |
| Td | <1150 | <1150 | <1150 | <1160* | <1050* | — | — | — | — |
| F | 0.28 | 0.33 | 0.38 | 0.9* | 0.86* | 1* | 1* | 1* | 1* |
| f | — | — | — | — | 15.8* | — | — | — | — |

TABLE 3

| | Ex. | | | | |
|---|---|---|---|---|---|
| | 19 | 20 | 21 | 22 | 23 |
| $SiO_2$ | 69.9 | 64.5 | 67.8 | 67.3 | 72 |
| $Al_2O_3$ | 2.5 | 6.0 | 2.7 | 1.7 | 1.1 |
| $B_2O_3$ | 0 | 0 | 3.0 | 0.1 | 0 |
| MgO | 13.6 | 11.0 | 10.4 | 15.0 | 5.5 |
| CaO | 0 | 0 | 0 | 0 | 8.6 |
| SrO | 0 | 0 | 0 | 0 | 0 |
| BaO | 0 | 0 | 0 | 0 | 0 |
| $ZrO_2$ | 0 | 2.5 | 0 | 0 | 0 |
| $Na_2O$ | 7.7 | 12.0 | 12.0 | 9.9 | 12.6 |
| $K_2O$ | 6.3 | 4.0 | 4.0 | 6.0 | 0.2 |
| Si + Al | 72.4 | 70.5 | 70.5 | 69.0 | 73.1 |
| Tg | 598* | 620 | 548* | 555* | 588 |
| T2 | 1600* | 1575 | 1508* | 1479* | 1510 |

TABLE 3-continued

| | Ex. | | | | |
|---|---|---|---|---|---|
| | 19 | 20 | 21 | 22 | 23 |
| T4 | 1163* | 1168 | 1052* | 1060* | 1052 |
| ρ | 2.43* | 2.525 | 2.427* | 2.467* | 2.49 |
| S | 550* | 946 | 765* | 540* | 713 |
| t | 56* | 34 | 56* | 58* | 10 |
| α | 87* | 91 | 89* | 94* | 86 |
| Td | — | <1140 | — | — | — |
| F | 0.8* | 0.13 | 0.03 | 0.13 | 0.12 |
| f | — | 12.2 | 12.2 | 12.2 | 12.2 |

TABLE 4

| | Ex. | | | | | | | | |
|---|---|---|---|---|---|---|---|---|---|
| | 1 | 2 | 3 | 4 | 5 | 6 | 7 | 8 | 9 |
| $SiO_2$ | 68.1 | 69.9 | 69.3 | 68.8 | 70.4 | 70.3 | 70.3 | 70.7 | 65.9 |
| $Al_2O_3$ | 5.0 | 3.3 | 3.3 | 3.3 | 3.3 | 3.3 | 3.3 | 3.4 | 5.5 |
| MgO | 7.8 | 7.6 | 7.2 | 6.9 | 6.9 | 6.9 | 7.8 | 7.8 | 8.3 |
| CaO | 0.3 | 0.3 | 0.3 | 0.3 | 0.3 | 0.3 | 0.3 | 0.3 | 0.3 |
| SrO | 0.1 | 0.1 | 0.1 | 0.1 | 0.1 | 0.1 | 0.1 | 0.1 | 0.05 |
| BaO | 0.1 | 0.1 | 0.1 | 0.1 | 0.1 | 0.1 | 0.1 | 0.1 | 0.05 |
| $ZrO_2$ | 1.0 | 1.0 | 2.0 | 3.0 | 1.0 | 1.0 | 1.0 | 1.0 | 2.4 |
| $Na_2O$ | 8.7 | 8.8 | 8.8 | 8.7 | 9.9 | 11.0 | 8.8 | 8.8 | 8.8 |
| $K_2O$ | 9.0 | 9.1 | 9.0 | 8.9 | 8.0 | 7.1 | 8.3 | 7.9 | 8.6 |

TABLE 5

| | Ex. | | | | | | | | |
|---|---|---|---|---|---|---|---|---|---|
| | 10 | 11 | 12 | 13 | 14 | 15 | 16 | 17 | 18 |
| $SiO_2$ | 65.5 | 67.5 | 67.3 | 68.3 | 70.5 | 75.2 | 76.4 | 74.0 | 74.8 |
| $Al_2O_3$ | 6.4 | 4.5 | 4.8 | 4.8 | 3.4 | 0 | 0 | 0 | 0 |
| MgO | 8.8 | 8.6 | 8.2 | 7.8 | 6.9 | 7.1 | 6.1 | 4.5 | 4.4 |
| CaO | 0.3 | 0.3 | 0.7 | 0.3 | 0 | 0 | 0 | 0 | 0 |
| SrO | 0.1 | 0.1 | 0.1 | 0 | 0 | 0 | 0 | 0 | 0 |
| BaO | 0.1 | 0.1 | 0.1 | 0 | 0 | 0 | 0 | 0 | 0 |
| $ZrO_2$ | 1.4 | 1.4 | 1.4 | 1.0 | 1.0 | 0 | 0 | 0 | 0 |
| $Na_2O$ | 8.8 | .8 | 8.8 | 8.8 | 11.0 | 10.3 | 15.8 | 12.9 | 15.4 |
| $K_2O$ | 8.7 | 8.8 | 8.7 | 9.0 | 7.1 | 7.4 | 1.7 | 8.7 | 5.3 |

TABLE 6

| | Ex. | | | | |
|---|---|---|---|---|---|
| | 19 | 20 | 21 | 22 | 23 |
| $SiO_2$ | 69.2 | 60.9 | 66.7 | 67.1 | 72.8 |
| $Al_2O_3$ | 4.2 | 9.6 | 4.6 | 2.8 | 1.9 |
| $B_2O_3$ | 0 | 0 | 3.4 | 0.1 | 0 |
| MgO | 9.0 | 7.0 | 6.9 | 10.1 | 3.7 |
| CaO | 0 | 0 | 0 | 0 | 8.1 |
| SrO | 0 | 0 | 0 | 0 | 0 |
| BaO | 0 | 0 | 0 | 0 | 0 |
| $ZrO_2$ | 0 | 4.8 | 0 | 0 | 0 |
| $Na_2O$ | 7.9 | 11.7 | 12.2 | 10.2 | 13.1 |
| $K_2O$ | 9.7 | 5.9 | 6.2 | 9.4 | 0.3 |

The present invention is applicable to a cover glass of a display device, its production, etc.

The entire disclosure of Japanese Patent Application No. 2009-241524 filed on Oct. 20, 2009 including specification, claims and summary is incorporated herein by reference in its entirety.

What is claimed is:

1. A display device, comprising:
   a display, and
   a cover glass,
   wherein the cover glass has a thickness of at most 1 mm;
   the cover glass comprises, by mole percentage based on the following oxides:
      from 67 to 75% of $SiO_2$,
      from 0 to 4% of $Al_2O_3$,
      from 7 to 15% of $Na_2O$,
      from 1 to 9% of $K_2O$,
      from 6 to 14% of MgO, and
      from 0 to 0.7% of $ZrO_2$,
   a total content of $SiO_2$ and $Al_2O_3$ in the cover glass is from 71 to 75%;
   a total content $Na_2O+K_2O$ of $Na_2O$ and $K_2O$ in the cover glass is from 12 to 20%; and
   a content in the cover glass of CaO, if present, is less than 1%.

2. The display device according to claim 1, wherein a $SiO_2$ content of the cover glass is from 69 to 74 mol %.

3. The display device according to claim 1, wherein an $Al_2O_3$ content of the cover glass is at least 0 mol % and less than 3 mol %.

4. The display device according to claim 1, wherein a MgO content of the cover glass is from 8 to 13 mol %.

5. The display device according to claim 1, wherein the total content $Na_2O+K_2O$ of the cover glass is higher than 13.5%.

6. The display device according to claim 1,
   wherein the cover glass comprises CaO, SrO, BaO, $ZrO_2$, or any combination thereof, and
   a total content of CaO, SrO, BaO, and $ZrO_2$ is less than 1.5%.

7. The display device according to claim 1, wherein a content in the cover glass of $B_2O_3$, if present, is less than 1%.

8. The display device according to claim 1, wherein a temperature at which a viscosity of the cover glass is $10^2$ dPa·s is at most 1,650° C.

9. The display device according to claim 1, wherein an average Linear expansion coefficient of the cover glass at from 50 to 350° C. is higher than $86 \times 10^{-7}$/° C.

10. The display device according to claim 1, wherein the display device is a mobile device.

11. The display device according to claim 1, wherein the display device is a touch panel.

12. The display device according to claim 1, wherein the thickness Of the cover glass is from 0.2 mm to 1 mm.

13. The display device according to claim 1, wherein a temperature at which a viscosity of the cover glass is $10^4$ dPa·s is at most 1,190° C.

14. The display device according to claim 1, wherein a $Li_2O$ content if present in the cover glass is at most 0.05%.

* * * * *